US010416191B2

(12) United States Patent
Montaño Rueda et al.

(10) Patent No.: US 10,416,191 B2
(45) Date of Patent: Sep. 17, 2019

(54) METHOD FOR VALIDATION OF A FUSE HEAD IN AN ELECTRONIC DETONATOR

(71) Applicant: MaxamCorp Holding, S.L., Madrid (ES)

(72) Inventors: Luis Diego Montaño Rueda, Galdácano-Vizcaya (ES); Hendrik Van Niekerk, Vizcaya (ES); José Manuel Botija González, Vizcaya (ES); Íñigo Zabalo Arena, Vizcaya (ES)

(73) Assignee: MaxamCorp Holding, S.L., Madrid (ES)

( * ) Notice: Subject to any disclaimer, the term of this patent is extended or adjusted under 35 U.S.C. 154(b) by 0 days.

(21) Appl. No.: 15/562,831

(22) PCT Filed: Mar. 29, 2016

(86) PCT No.: PCT/EP2016/056824
§ 371 (c)(1),
(2) Date: Sep. 28, 2017

(87) PCT Pub. No.: WO2016/156333
PCT Pub. Date: Oct. 6, 2016

(65) Prior Publication Data
US 2018/0106836 A1    Apr. 19, 2018

(30) Foreign Application Priority Data

Mar. 30, 2015 (EP) .................... 15382155

(51) Int. Cl.
*G01R 31/07* (2006.01)
*G01R 1/067* (2006.01)
*F42C 19/00* (2006.01)
*F42C 21/00* (2006.01)
(Continued)

(52) U.S. Cl.
CPC .............. *G01R 1/067* (2013.01); *F41A 19/58* (2013.01); *F42B 3/122* (2013.01); *F42C 11/02* (2013.01);
(Continued)

(58) Field of Classification Search
CPC ........ G01R 1/067; G01R 1/30; G01R 31/048; G01R 31/6276; F42C 15/40; F42C 15/44;
(Continued)

(56) References Cited

U.S. PATENT DOCUMENTS

| 3,555,490 A | 1/1971 | Williams et al. |
| 3,778,709 A | 12/1973 | Williams et al. |
| 6,618,237 B2* | 9/2003 | Eddy ...................... F42B 3/121 102/217 |

FOREIGN PATENT DOCUMENTS

| DE | 3731012 | 10/1988 |
| FR | 2179645 | 11/1973 |

(Continued)

OTHER PUBLICATIONS

"European Application No. 15382155.8, Extended European Search Report dated Oct. 21, 2015", (Oct. 21, 2015), 4 pgs.
(Continued)

*Primary Examiner* — Minh N Tang
(74) *Attorney, Agent, or Firm* — Schwegman Lundberg & Woessner, P.A.

(57) ABSTRACT

A method for the validation of a fuse head in an electronic detonator is disclosed, the method including measuring at least once a first charge time; activating a switching means to a second position to replace a reference resistor in an RC circuit with the fuse head; measuring at least once a second charge time; and determining the deviation of the second charge time from the first charge time.

14 Claims, 2 Drawing Sheets

(51) Int. Cl.
*G01R 31/04* (2006.01)
*F41A 19/58* (2006.01)
*F42B 3/12* (2006.01)
*F42C 11/02* (2006.01)
*F42C 15/40* (2006.01)
*G01R 1/30* (2006.01)
*H01R 13/627* (2006.01)
*H01R 13/637* (2006.01)

(52) U.S. Cl.
CPC .............. *F42C 15/40* (2013.01); *F42C 19/00* (2013.01); *F42C 21/00* (2013.01); *G01R 1/30* (2013.01); *G01R 31/048* (2013.01); *H01R 13/6276* (2013.01); *H01R 13/637* (2013.01)

(58) Field of Classification Search
CPC ...... F42B 3/12; F42B 3/13; F42B 3/18; F42B 3/121; F42B 3/122
See application file for complete search history.

(56) References Cited

FOREIGN PATENT DOCUMENTS

| | | |
|---|---|---|
| GB | 1377398 | 12/1974 |
| GB | 2197084 | 5/1988 |
| NL | 7116040 | 6/1972 |
| WO | WO-1990001670 | 2/1990 |
| WO | WO-2016156333 | 10/2016 |

OTHER PUBLICATIONS

"International Application No. PCT/EP2016/056824, International Search Report and Written Opinion dated May 12, 2016", (May 12, 2016), 10 pgs.

\* cited by examiner ical Field of the Invention

METHOD FOR VALIDATION OF A FUSE HEAD IN AN ELECTRONIC DETONATOR

PRIORITY CLAIM TO RELATED APPLICATIONS

This application is a U.S. national stage application filed under 35 U.S.C. § 371 from International Application Serial No. PCT/EP2016/056824, which was filed 29 Mar. 2016, and published as WO2016/156333 on 6 Oct. 2016, and which claims priority to European Application No. 15382155.8, filed 30 Mar. 2015, which applications and publication are incorporated by reference as if reproduced herein and made a part hereof in their entirety, and the benefit of priority of each of which is claimed herein.

TECHNICAL FIELD OF THE INVENTION

The present invention relates to a method for validating fuse heads in a circuit and, more particularly, in a detonator circuit.

BACKGROUND OF THE INVENTION

The electronic detonators comprise an electronic circuit connected to wires providing a voltage. The fuse head is connected to the detonator circuit and is adapted to initiate the explosive charge included in the detonator when a current upper than a determined threshold flows through the fuse head.

In the process of manufacturing of the detonator the fuse head is welded to the electronic circuit of the detonator. However, the welding may be correctly performed or not. If the welding is well performed the detonator may work correctly. In the case where the fuse head is not correctly welded the fuse head may not initiate the explosive charge or may initiate the explosive charge for a current lower or higher than the determined threshold, thus compromising the quality of the detonator and implying economic costs and safety risks.

One known method to validate the welding of the fuse head in a detonator uses a multimeter to measure the resistance of the fuse head in the electronic circuit. The problem of this method is that this measurement must be performed before the detonator is assembled because when the detonator is assembled and the electronic circuit is inside the metallic shell loaded with the explosive charge, the measuring leads cannot reach the fuse head.

Therefore, there is a need for a method for safely validating the fuse heads assembled in electronic detonators, even after the fuse head has been assembled inside the metallic shell of the detonator.

SUMMARY OF THE INVENTION

The present invention provides a solution for the aforementioned problem, by means of a method for the validation of a fuse head in an electronic detonator and an electronic detonator.

In a first inventive aspect, the invention provides a method for the validation of a fuse head in an electronic detonator, wherein said detonator comprises:
 a reference resistor,
 a fuse head,
 at least one capacitor, and
 switching means, wherein in a first position of the switching means, the reference resistor is connected to the at least one capacitor forming a first RC circuit, and
 in a second position of the switching means, the fuse head is connected to the at least one capacitor forming a second RC circuit,
the method comprising the following steps:
 a) measuring at least once a first charge time $t_1$, the first charge time $t_1$ being the time required for the at least one capacitor to reach a specified charge value in the first RC circuit, when the switching means is in the first position,
 b) activating the switching means to the second position,
 c) measuring at least once a second charge time $t_2$, the second charge time $t_2$ being the time required for the at least one capacitor in the second RC circuit to reach the same specified charge value as specified in step a),
 d) determining if the second charge time $t_2$ is within a range $(t_1-\lambda_1, t_1+\lambda_2)$, $t_1$ being the first charge time, $t_1-\lambda_1$ being a first validation threshold and $t_1+\lambda_2$ being a second validation threshold.

The method is thus based on measuring the charge time of the at least one capacitor in the first and second RC circuits until a specified charge value and determining the deviation of the second charge time, which corresponds to the second RC circuit, from the first charge time, which corresponds to the first RC circuit. When the second charge time $t_2$ falls within the defined range, the fuse head is considered valid. Otherwise, the fuse head is considered not valid. The specified charge value is a security value wherein the current which flows through the fuse head does not initiate the detonation of the explosive.

Advantageously, this method provides a secure way to safely validate the resistance of the fuse head and the welding of the fuse head to the electronic circuit of the detonator, even when the electronic circuit is assembled within the metallic shell of the detonator with the explosive charge. Throughout this document "validating" shall be construed as determining the validity.

The range $(t_1-\lambda_1, t_1+\lambda_2)$ for validating the fuse head may be defined according to the user's needs and the variability which is acceptable for a particular fuse head. In one embodiment, $\lambda_1=\lambda_2$ and therefore the first charge time $t_1$ is in the middle of the range. In other embodiments, the acceptable variability above and below the first charge time $t_1$ is not the same, for example in cases in which it is necessary to define the range far from a value that may initiate the explosive charge of the fuse head, therefore $\lambda_1 \neq \lambda_2$ and the validation range is not symmetric relative to the first charge time $t_1$.

The first and second validation thresholds quantify the maximum variability acceptable for a particular fuse head. In an embodiment, the first and second validation thresholds are set in the firmware of a microcontroller included in the electronic detonator.

In a particular embodiment, the method comprises an additional intermediate step between steps a) and c), which comprises discharging the at least one capacitor. In one embodiment, the intermediate step is performed between steps a) and b), wherein the at least one capacitor is discharged in the first RC circuit. In other embodiment, the intermediate step is performed between steps b) and c), wherein the at least one capacitor is discharged in the second RC circuit. In a preferred embodiment the discharging step is performed until the output voltage of the RC circuit is lower than or equal to a first charging threshold, preferably until the output voltage is 0 V.

In a particular embodiment, discharging the at least one capacitor further comprises short-circuiting the at least one capacitor during a determined period of time. Advantageously, this embodiment guarantees that the capacitor is not charged and the precision of the measurement of the second charge time is increased.

In a particular embodiment, the method comprises the further step of calculating the resistance of the fuse head.

In a particular embodiment, calculating the resistance $R_{fuse}$ of the fuse head comprises applying the following expression, $$R_{fuse} = R_{ref} * \frac{t_2}{t_1}$$

wherein, $t_2$ is the second charge time measured in step c),
$t_1$ is the first charge time measured in step a) and
$R_{ref}$ is the resistance of the reference resistor.

In a particular embodiment, the measurement of the time required for the at least one capacitor to reach a specified charge value at step a) is taken at least twice and the first charge time $t_1$ is obtained as the mean of the measurements taken.

Advantageously, this embodiment improves the accuracy in the determination of the first charge time. In this case, the method takes more than one measurement and therefore the reliability and the accuracy of the method are increased, because even in the case where there is an error in any of the measurements, the final charge time $t_2$ considered for the comparison is the mean of the measurements taken and any potential error is compensated.

In a particular embodiment, the measurement of the time required for the at least one capacitor to reach a specified charge value at step c) is taken at least twice and the second charge time $t_2$ is obtained as the mean of the measurements taken.

Advantageously, in this case, the reliability and the accuracy of the final measurement are increased, because even in the case of an error in any of the measurements, the second charge time $t_2$ considered for the comparison is the mean of the measurements taken and the errors in said measurements are compensated.

In a particular embodiment, the reference resistor is a precision resistor with a resistance equal to the nominal resistance of the fuse head.

Advantageously, the use of a precision resistor allows having a more accurate measurement of the first charge time $t_1$. Also the comparison result has a higher accuracy because the precision resistor has a resistance equal to the nominal resistance of the fuse head and the first and second validation thresholds can be optimized.

In a particular embodiment, the method steps are performed by a microcontroller comprised in the electronic detonator.

In a particular embodiment, the detonator comprises a second capacitor, the two capacitors being connected in parallel, and the first charge time $t_1$ and the second charge time $t_2$ being the time required for both capacitors to reach a specified charge value.

In a second inventive aspect, the invention provides an electronic detonator, which comprises:
 a reference resistor,
 a fuse head,
 at least one capacitor,
 switching means, wherein in a first position of the switching means, the reference resistor is connected to the at least one capacitor forming a first RC circuit, and in a second position of the switching means, the fuse head is connected to the at least one capacitor forming a second RC circuit, and a microcontroller, wherein the microcontroller is configured to perform the method steps of the method according to the first inventive aspect.

Advantageously, this invention provides an electronic detonator adapted to safely validate the fuse head assembled in it.

In an embodiment the electronic detonator comprises a second capacitor, wherein the two capacitors are connected in parallel.

In an embodiment, the first and second validation thresholds $(t_1-\lambda_1, t_1+\lambda_2)$ are set in the firmware of the microcontroller.

All the features described in this specification (including the claims, description and drawings) and/or all the steps of the described method can be combined in any combination, with the exception of combinations of such mutually exclusive features and/or steps.

DESCRIPTION OF THE DRAWINGS

These and other characteristics and advantages of the invention will become clearly understood in view of the detailed description of the invention which becomes apparent from a preferred embodiment of the invention, given just as an example and not being limited thereto, with reference to the drawings.

DETAILED DESCRIPTION OF THE INVENTION

Figure 1:
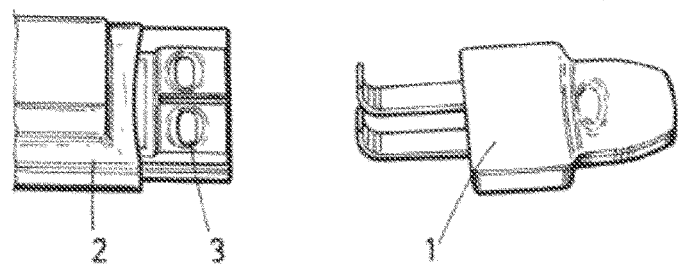
FIG. 1 This figure shows the fuse head and the connections points of an electronic circuit used in the method of the invention.
Figure 2:
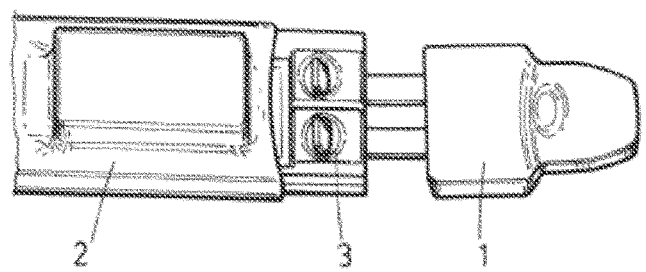
FIG. 2 This figure shows the fuse head connected to an electronic circuit used in the method of the invention.
Figure 3:
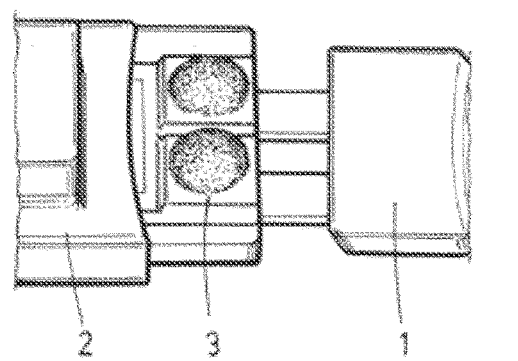
FIG. 3 This figure shows the fuse head welded to an electronic circuit used in the method of the invention.

FIGS. 1, 2 and 3 show the assembly process of a fuse head in an electronic circuit of an electronic detonator.

FIG. 1 shows the fuse head (1) and a terminal (2) of the electronic circuit. This terminal (2) comprises two connection points (3) for the connection of the fuse head (1).

FIG. 2 shows the fuse head (1) connected to the terminal (2) of the electronic circuit through the connection points (3).

FIG. 3 shows the fuse head (1) welded to the terminal (2) of the electronic circuit through the connection points (3). This welding shown in FIG. 3 may be irregular due to the fact that the amount of tin used is not controlled. This may result in the creation of short circuits or open circuits in the electronic circuit of the detonator, thus compromising the quality of the detonators and implying economic costs and safety risks. Also, it is important to ensure prior to the use of the detonator if the welding of the fuse head (1) or the fuse head (1) itself have been damaged after the assembling of the detonator elements, e.g. during transportation or storage.

Thus, in an embodiment of the invention the validation method is automatically performed during the programming of the electronic detonator.

Figure 4:
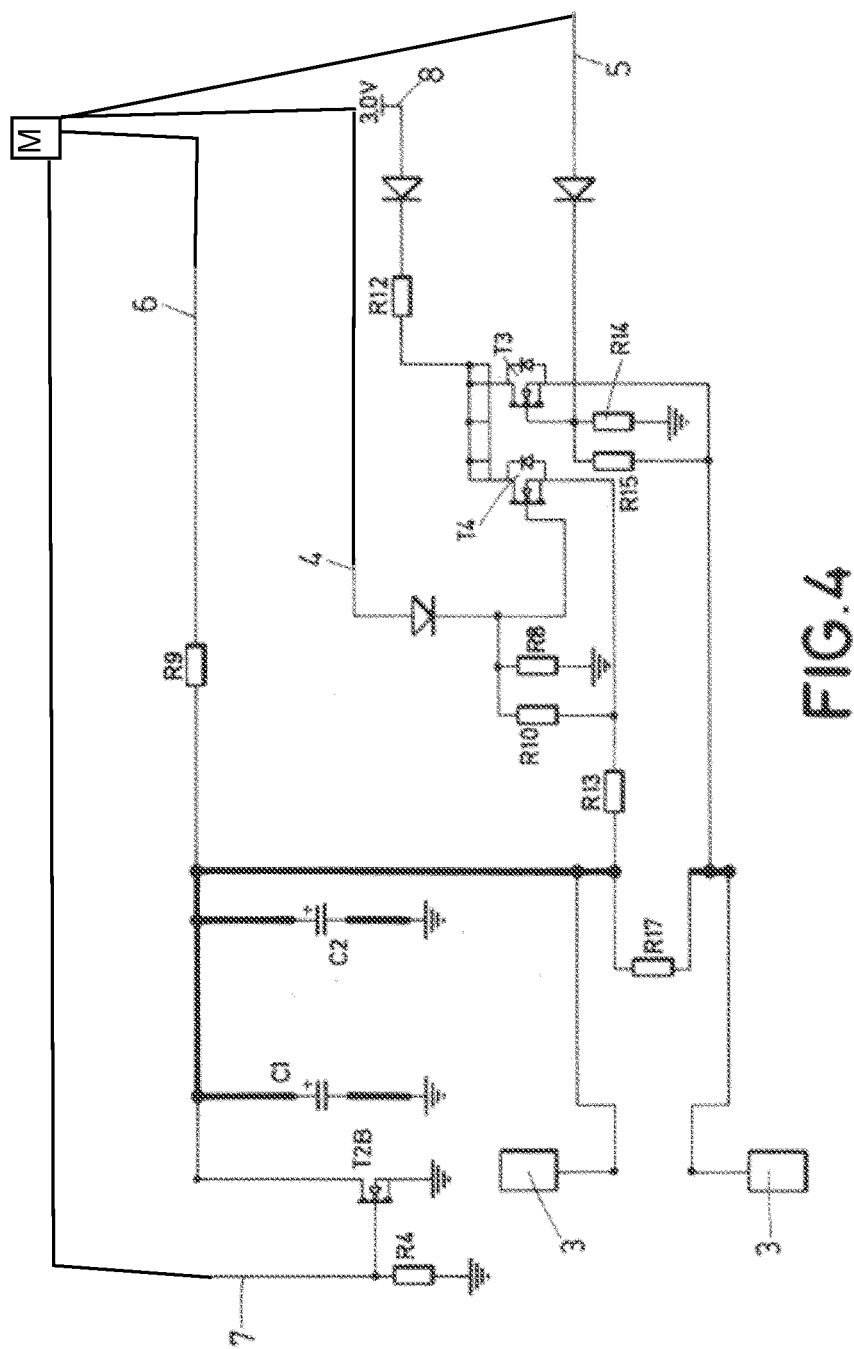
FIG. 4 This figure shows an embodiment of an electronic circuit used in an embodiment of the invention.

FIG. 4 shows an electronic circuit used in an embodiment of the invention, including the following elements:
- Connection points (3).
- A first input point (4), a second input point (5).
- An output point (6).
- Capacitors C1 and C2.
- The resistor R13 as reference resistor.
- The transistors T3 and T4, acting as switching means, in particular acting as a first switch and second switch, respectively.
- Resistors (R8, R12, R10, R15, R14).
- A discharge circuit (7).

The connection points (3) are adapted for attachment and welding of the fuse head (1).

The first input point (4) is adapted to send an instruction to the switching means to set it in a position adapted to measure the first charge time $t_1$.

The second input point (5) is adapted to send instruction to the switching means to set it in a position adapted to measure the second charge time $t_2$.

The output point (6) is adapted to transmit the first charge time $t_1$ or/and the second charge $t_2$ time to a microcontroller.

The resistor (R13) is a precision resistor, i.e. its tolerance and variability of its properties along the time are very low. The resistor R12 is adapted to limit the current which flows through the precision resistor and the fuse head (1) in order to avoid an undesirable accidental initiation of the explosive charge attached to the fuse head (1). The resistors (R8, R10, R15, R14) are resistors adapted to polarise the transistors T4 and T3, which work as a first switch and a second switch and said switches are adapted to connect the resistor R13 and disconnect the fuse head (1) to measure the charge time of the capacitors, in the case of the first switch, and to connect the fuse head (1) and disconnect the resistor R13 to measure the charge time of the capacitors, in the case of the second switch.

The capacitors C1 and C2 are connected in parallel to each other. In this way, the charge time is the same as for a capacitor with a capacitance C1+C2.

In the embodiment shown in FIG. 4, the microcontroller M is adapted to be connected through the first input point (4), the second input point (5), the output point (6) and the discharge circuit (7). Through these input (4, 5) and output (6) points, the microcontroller M is able to communicate and send instructions to the circuit. The microcontroller M is adapted to perform the steps according to an embodiment of the invention:

1) Activating through the first input point (4) the first switch and thus setting the switching means in a first position.

In this step the microcontroller activates the transistor T4. The current from the voltage source (8) flows through the resistor R12, the transistor T4 and the precision resistor R13 and loads the capacitors C1 and C2.

2) Measuring at least once a first charge time, the first charge time $t_1$ being the time required for the capacitors to reach a specified charge value in the first RC circuit, when the switching means is in the first position.

After performing the first measurement, the capacitors should be discharged until a certain level. To accelerate this process in this embodiment, the microcontroller activates the discharge circuit (7) through the transistor T2B. In this embodiment, the capacitors are short-circuited to ground through the transistor T2B, until the output voltage of the RC circuit is equal to 0V.

3) Activating through the second input point (5) the second switch and thus setting the switching means in the second position, to replace the reference resistor (R13) with the fuse head (1).

In this step the microcontroller activates the transistor T3. The current from the voltage source (8) flows through the resistor R12, the transistor T3 and the parallel of the resistors R17 and the fuse head (1) connected to the connection points (3). Since the resistance of resistor R17 is much higher than the impedance of the fuse head (1), the current flows only through the fuse head (1) and loads the capacitors C1 and C2.

4) Measuring at least once a second charge time $t_2$, the second charge time being the time required for the capacitors in the second RC circuit to reach the same specified charge value as specified in step 2.

5) Determining if the second charge time $t_2$ is within a range $(t_1-\lambda_1, t_1+\lambda_2)$, $t_1$ being the first charge time, $t_1-\lambda_1$ being a first validation threshold and $t_1+\lambda_2$ being a second validation threshold. If the second charge time $t_2$ falls within the specified range, the fuse head (1) is considered valid. On the contrary, if the second charge time $t_2$ is lower than $t_1-\lambda_1$ or greater than $t_1+\lambda_2$, the fuse head (1) is considered not valid.

In one embodiment, $\lambda_1=\lambda_2=10\% \, t_1$. In this embodiment the range for validation would thus be $(0.9 \, t_1, 1.1 \, t_1)$.

In one embodiment, the detonator is adapted to store in a memory device the comparison performed and/or to send the results to an external entity and/or to display the results in a display.

Preferably, the detonator is adapted to be connected to an external device, which can test the conditions of the detonator even when said detonator is placed in a localization to be used, for example in underground or open pit mining operations.

Thanks to the method of the invention the validity of a detonator can be checked before its use. In the case of a controlled blast it is crucial that all the detonators work properly, therefore this method provides a solution to validate the fuse head (1) in order to guarantee the proper operation of the detonator.

The invention claimed is:

1. A method for the validation of a fuse head in an electronic detonator, said detonator comprising:
   a reference resistor,
   a fuse head,
   at least one capacitor, and
   switching means, wherein
     in a first position of the switching means, the reference resistor is connected to the at least one capacitor forming a first RC circuit, and
     in a second position of the switching means, the fuse head is connected to the at least one capacitor forming a second RC circuit; and
   wherein the method comprises the following steps:
   a) measuring at least once a first charge time $t_1$, the first charge time being the time required for the at least one capacitor to reach a specified charge value in the first RC circuit, when the switching means is in the first position,
   b) activating the switching means to the second position,
   c) measuring at least once a second charge time $t_2$, the second charge time being the time required for the at least one capacitor in the second RC circuit to reach the same specified charge value as specified in step a), and d) determining if the second charge time is within a range $(t_1-\lambda_1, t_1+\lambda_2)$, $t_1$ being the first charge time, $t_1-\lambda_1$ being a first validation threshold and $t_1+\lambda_2$ being a second validation threshold.

2. The method according to claim 1, wherein the method comprises an additional intermediate step between steps a) and c), which comprises:
   discharging the at least one capacitor, until the output voltage of the first RC circuit or the second RC circuit is lower than or equal to a charging threshold.

3. The method according to claim 2, wherein discharging the at least one capacitor comprises short-circuiting the at least one capacitor during a determined period of time.

4. The method according to claim 2, wherein the charging threshold is 0V.

5. The method according to claim 1, wherein the method comprises the further step of calculating the resistance of the fuse head.

6. The method according to claim 5, wherein calculating the resistance $R_{fuse}$ of the fuse head comprises applying the following expression:

$$R_{fuse} = R_{ref} * \frac{t_2}{t_1}$$

wherein
   $t_2$ is the second charge time measured in step c),
   $t_1$ is the first charge time measured in step a) and
   $R_{ref}$ is the resistance of the reference resistor.

7. The method according to claim 1, wherein in step a) the measurement of the time required for the at least one capacitor to reach a specified charge value is taken at least twice and the first charge time $t_1$ is obtained as the mean of the measurements taken.

8. The method according to claim 1, wherein in step c) the measurement of the time required for the at least one capacitor to reach a specified charge value is taken at least twice and the second charge time $t_2$ is obtained as the mean of the measurements taken.

9. The method according to claim 1, wherein the reference resistor is a precision resistor with a resistance equal to the nominal resistance of the fuse head.

10. The method according to claim 1, wherein the method steps are performed by a microcontroller comprised in the electronic detonator.

11. The method according to claim 1, wherein the detonator comprises a second capacitor, the two capacitors being connected in parallel, and the first charge time $t_1$ and the second charge time $t_2$ being the time required for both capacitors to reach a specified charge value.

12. An electronic detonator comprising:
   a reference resistor,
   a fuse head,
   at least one capacitor,
   switching means, wherein
      in a first position of the switching means, the reference resistor is connected to the at least one capacitor forming a first RC circuit, and
      in a second position of the switching means, the fuse head is connected to the at least one capacitor forming a second RC circuit, and
   a microcontroller, wherein the microcontroller is configured to perform the method according to claim 1.

13. The electronic detonator according to claim 12, further comprising a second capacitor, the two capacitors being connected in parallel.

14. The electronic detonator according to claim 12, wherein the first and second validation thresholds $(t_1-\lambda_1, t_1+\lambda_2)$ are set in the firmware of the microcontroller.

* * * * *